United States Patent
Ghyselen et al.

(10) Patent No.: US 7,803,694 B2
(45) Date of Patent: Sep. 28, 2010

(54) PROCESS FOR TRANSFERRING A LAYER OF STRAINED SEMICONDUCTOR MATERIAL

(75) Inventors: Bruno Ghyselen, Seyssinet (FR); Daniel Bensahel, Grenoble (FR); Thomas Skotnicki, Crolles-Monfort (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/170,583

(22) Filed: Jul. 10, 2008

(65) Prior Publication Data

US 2008/0265261 A1    Oct. 30, 2008

Related U.S. Application Data

(62) Division of application No. 12/040,134, filed on Feb. 29, 2008, now Pat. No. 7,534,701, which is a division of application No. 11/165,339, filed on Jun. 24, 2005, now Pat. No. 7,338,883, which is a division of application No. 10/615,259, filed on Jul. 9, 2003, now Pat. No. 6,953,736.

(60) Provisional application No. 60/445,825, filed on Feb. 10, 2003.

(30) Foreign Application Priority Data

Jul. 9, 2002 (FR) .................. 02 08602

(51) Int. Cl.
*H01L 21/30* (2006.01)
*H01L 21/46* (2006.01)
(52) U.S. Cl. ................ 438/458; 257/E21.122
(58) Field of Classification Search ........... 438/455, 438/458; 257/E21.122
See application file for complete search history.

(56) References Cited

U.S. PATENT DOCUMENTS 5,013,681 A    5/1991    Godbey et al. ........... 437/86

(Continued)

FOREIGN PATENT DOCUMENTS

EP    0 849 788 A2    6/1998

(Continued)

OTHER PUBLICATIONS

Bauer et al., "Relaxed SiGe buffers with thicknesses below 0.1 μm," Thin Solid Films 369: 152-156 (2000).

(Continued)

*Primary Examiner*—W. David Coleman
*Assistant Examiner*—Christine Enad
(74) *Attorney, Agent, or Firm*—Winston & Strawn LLP

(57) ABSTRACT

Semiconductor wafers having a thin layer of strained semiconductor material. These structures include a substrate; an oxide layer upon the substrate; a silicon carbide (SiC) layer upon the oxide layer, and a strained layer of a semiconductor material in a strained state upon the silicon carbide layer, or a matching layer upon the donor substrate that is made from a material that induces strain in subsequent epitaxially grown layers thereon; a strained layer of a semiconductor material of defined thickness in a strained state; and an insulating or semi-insulating layer upon the strained layer in a thickness that retains the strained state of the strained layer. The insulating or semi-insulating layers are made of silicon carbide or oxides and act to retain strain in the strained layer.

11 Claims, 9 Drawing Sheets

U.S. PATENT DOCUMENTS

| | | | |
|---|---|---|---|
| 5,374,564 A | 12/1994 | Bruel | 437/24 |
| 5,882,987 A | 3/1999 | Srikrishnan | 438/458 |
| 5,906,951 A | 5/1999 | Chu et al. | 438/751 |
| 6,059,895 A | 5/2000 | Chu et al. | 148/33.1 |
| 6,100,166 A | 8/2000 | Sakaguchi et al. | 438/455 |
| 6,171,965 B1 | 1/2001 | Kang et al. | 438/695 |
| 6,194,245 B1 | 2/2001 | Tayanaka | 438/57 |
| 6,323,108 B1 | 11/2001 | Kub et al. | 438/458 |
| 6,335,231 B1 | 1/2002 | Yamazaki et al. | 438/151 |
| 6,372,609 B1 | 4/2002 | Aga et al. | 438/459 |
| 6,382,292 B1 | 5/2002 | Ohmi et al. | 156/584 |
| 6,403,450 B1 | 6/2002 | Maleville et al. | 438/471 |
| 6,410,371 B1 | 6/2002 | Yu et al. | 438/151 |
| 6,524,935 B1 * | 2/2003 | Canaperi et al. | 438/478 |
| 6,537,370 B1 | 3/2003 | Hernandez et al. | 117/88 |
| 6,562,703 B1 | 5/2003 | Maa et al. | 438/518 |
| 6,573,126 B2 | 6/2003 | Cheng et al. | 438/149 |
| 6,573,159 B1 | 6/2003 | Kobayashi et al. | 438/471 |
| 6,589,333 B1 | 7/2003 | Gosele et al. | 117/84 |
| 6,603,156 B2 | 8/2003 | Rim | 257/190 |
| 6,737,670 B2 | 5/2004 | Cheng et al. | 257/19 |
| 6,790,747 B2 | 9/2004 | Henley et al. | 438/458 |
| 6,846,718 B1 | 1/2005 | Aga et al. | 438/406 |
| 7,029,993 B1 | 4/2006 | Barge et al. | 438/475 |
| 2002/0030227 A1 | 3/2002 | Bulsara et al. | 257/346 |
| 2002/0061660 A1 | 5/2002 | Ito | 438/795 |
| 2002/0072130 A1 * | 6/2002 | Cheng et al. | 438/10 |
| 2002/0140031 A1 | 10/2002 | Rim | 257/347 |
| 2002/0168864 A1 | 11/2002 | Cheng et al. | 438/725 |
| 2003/0089901 A1 | 5/2003 | Fitzgerald | 257/19 |
| 2003/0227057 A1 * | 12/2003 | Lochtefeld et al. | 257/347 |
| 2006/0189102 A1 | 8/2006 | Barge et al. | 438/475 |

FOREIGN PATENT DOCUMENTS

| | | |
|---|---|---|
| EP | 1 045 448 A1 | 10/2000 |
| EP | 1 050 901 A2 | 11/2000 |
| EP | 1 061 565 A1 | 12/2000 |
| EP | 1 158 581 A1 | 11/2001 |
| FR | 2 777 115 A1 | 10/1999 |
| FR | 2 797 713 A1 | 2/2001 |
| GB | 2 365 214 A | 2/2002 |
| JP | 2001-168342 | 6/2001 |
| JP | 2001-284558 A | 10/2001 |
| WO | WO 00/15885 A1 | 3/2000 |
| WO | WO 01/11930 A2 | 2/2001 |
| WO | WO 01/15215 A1 | 3/2001 |
| WO | WO 01/28000 A1 | 4/2001 |
| WO | WO 01/99169 A2 | 12/2001 |
| WO | WO 02/15244 A2 | 2/2002 |
| WO | WO 02/27783 A1 | 4/2002 |
| WO | WO 02/071491 A1 | 9/2002 |
| WO | WO 02/071493 A2 | 9/2002 |
| WO | WO 02/080241 A1 | 10/2002 |
| WO | WO 03/017358 A1 | 2/2003 |
| WO | WO 2004/006327 A2 | 1/2004 |

OTHER PUBLICATIONS

Cheng et al., "SiGe-On-Insulator (SGOI): Substrate Preparation and MOSFET Fabrication for Electron Mobility Evaluation," 2001 IEEE International SOI Conference, Oct. 1, 2001, pp. 13-14.

Delhougne et al., "Development of a new type of SiGe thin strain relaxed buffer based on the incorporation of a carbon-containing layer," Applied Surface Science 224(1-4):91-94 (2004).

Egloff et al., "Evaluation of Strain Sources in Bond and Etchback Silicon-on-Insulator," Philips J. Res. 49(1-2): 125-138 (1995).

Fitzgerald et al., "Relaxed $Ge_xSi_{1-x}$ structures for III-V integration with Si and high mobility two-dimensional electron gases in Si," J. Vac. Sci. Technol. B 10(4): 1807-1819 (1992).

Hobart et al., "On Scaling the Thin Film Si Thickness of SOI Substrates, A Perspective on Wafer Bonding for Thin Film Devices," Naval Research Laboratory, Electronics Science and Technology Division, Washington, DC 20375, 10 pages (undated).

Hollander et al., "Strain relaxation of pseudomorphic $Si_{1-x}Ge_x$/ Si(100) heterostructures after hydrogen or helium ion implantation for virtual substrate fabrication," Nuclear Instruments and Methods in Physics Research B 175-177: 357-367 (2001).

Huang et al., "SiGe-on-insulator prepared by wafer bonding and layer transfer for high-performance field-effect transistors," Applied Physics Letters 78(9): 1267-1269 (2001).

Langdo et al., "SiGe-free strained Si on insulator by wafer bonding and layer transfer," Applied Physics Letters 82(24): 4256-4258 (2003).

Lyutovich et al., "Thin SiGe buffers with high Ge content for n-MOSFETs," Materials Science and Engineering B89: 341-345 (2002).

Mizuno et al., "High Performance Strained-Si p-MOSFETs on SiGe-on-Insulator Substrates Fabricated by SIMOX Technology," IDEM Technical Digest, pp. 934-936 (1999).

Tan et al., "Temperature and Stress Distribution in the SOI Structure During Fabrication," IEEE Transactions on Semiconductor Manufacturing 16(2): 314-318 (2003).

Taraschi et al., "Relaxed SiGe-on-insulator fabricated via wafer bonding and etch back," J. Vac. Sci. Technol. B 20(2): 725-727 (2002).

Tong et al., "Semiconductor on Wafer Bonding: Science and Technology," John Wiley & Sons, Inc., pp. 1-15 and 81-99.

* cited by examiner

FIG. 5e
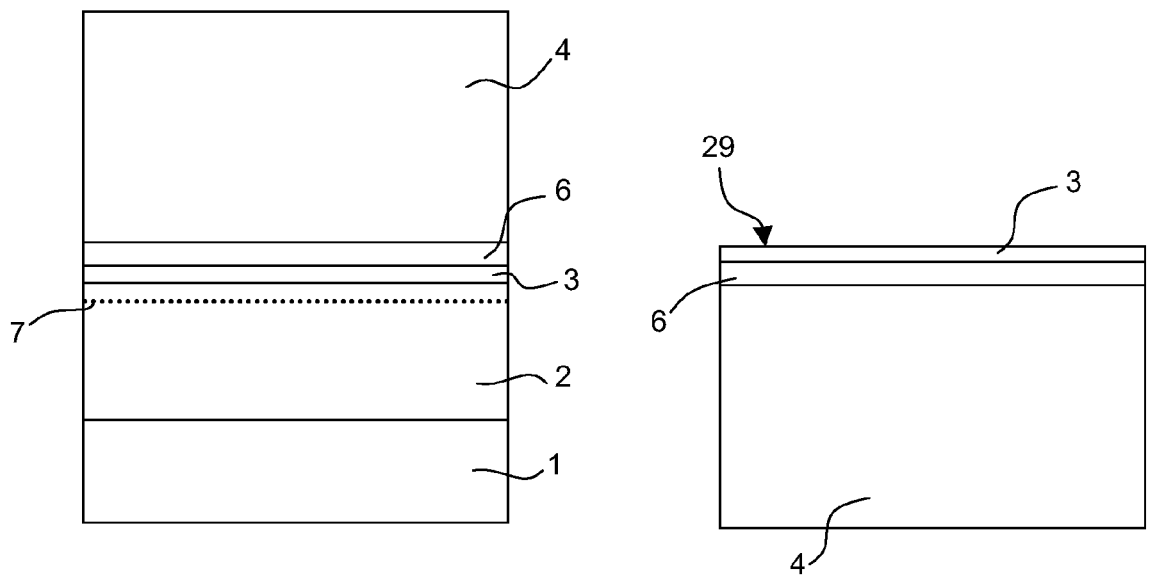
FIG. 5f
FIG. 5g

PROCESS FOR TRANSFERRING A LAYER OF STRAINED SEMICONDUCTOR MATERIAL

CROSS-REFERENCE TO RELATED APPLICATIONS

This application is a divisional of U.S. application Ser. No. 12/040,134 filed Feb. 29, 2008 now U.S. Pat No. 7,534,701, which is a divisional of U.S. application Ser. No. 11/165,339, filed Jun. 24, 2005, now U.S. Pat. No. 7,338,883, which is a divisional of U.S. application Ser. No. 10/615,259, filed Jul. 9, 2003, now U.S. Pat. No. 6,953,736, which claims the benefit of U.S. Provisional Application No. 60/445,825, filed Feb. 10, 2003.

FIELD OF THE INVENTION

The present invention relates to the transfer of a thin layer of a donor wafer to a receiving substrate in order to form structures such as a semiconductor-on-insulator structure. The invention is aimed more particularly at carrying out this transfer in order to produce electronic structures comprising strained layers.

BACKGROUND OF THE INVENTION

Several processes and techniques for transferring semiconductor layers, such as Si or SiGe layers, have been proposed, in which the donor wafer comprises in succession a single-crystal silicon support substrate and a thickness of SiGe. Zhi-Yuan Cheng et al. of Massachusetts Institute of Technology has presented, in a document entitled "SiGe-On-Insulator (SGOI): Substrate Preparation and MOSFET Fabrication for Electron Mobility Evaluation" (2001 IEEE International SOI Conference, 10/01), two known techniques for transferring layers applied to the donor wafer including a SiGe buffer layer.

The first of these layer transfer techniques is called "etch-back". It consists of removing, by chemical-mechanical means, the single-crystal Si support substrate and the SiGe buffer layer after bonding the donor wafer to the receiving substrate. In particular, an etching called "selective etching" is used to remove the buffer layer, as this has the ability of etching the strained SiGe of the buffer layer more easily than the relaxed SiGe of the surface layer. The relaxed SiGe layer then behaves as a "stop layer" for the etching, since the etching stops at least partly at the level thereof.

Finally, a strained Si film is then grown epitaxially on the relaxed SiGe layer in order to produce a strained Si-on-SiGe structure. In this final structure, a layer of relaxed material (in this case, the layer of SiGe) is interposed between the layer of strained material (in this case the Si film) and the oxide.

This may substantially reduce the technical performance expected of the Si/SiGe combination, and especially its electrical properties. Thus, for example, the SiGe layer may have a tendency to increase the circuit capacitances and therefore reduce the switching rates of the electronic components to be produced or produced in the Si/SiGe active part.

The fabrication of electronic components in the active part of such a structure comprising this combination having two on-insulator layers also has the risk of being complex to carry out, especially by the creation of lateral insulating regions in the on-insulator combination. This process furthermore limits the application to the production of an Si/SiGe-on-insulator structure and provides no solution to the production, for example, of a strained Si-on-insulator structure.

Other etch-back techniques and processes have also been proposed, for example, in U.S. Pat. No. 5,013,681, in which an unstrained Si layer is especially transferred.

The second layer transfer technique reported in the document by Zhi-Yuan Cheng et al. is based on the SMARTCUT® technology of Soitec S. A., which is known to those skilled in the art, and descriptions of which may be found in a number of works dealing with wafer reduction techniques. In the SMARTCUT® process, before bonding, an ion species is implanted into the relaxed SiGe layer to create a region of weakness therein. After bonding, the donor wafer splits or is cut at the region of weakness. What is obtained therefore is, on the one hand, a donor wafer, stripped of part of the relaxed SiGe layer, and, on the other hand, a structure comprising, bonded together, a removed thin layer of relaxed SiGe and the receiving substrate. The SMARTCUT® technique is advantageous in that it affords the possibility of recycling the donor wafer instead of sacrificing it, unlike the etch-back technique.

Other processes have been proposed, using the two techniques simultaneously. U.S. Pat. No. 5,882,987 and a document by K. D. Hobart et al. from the Naval Research Laboratory in Washington ("On scaling the thin film Si thickness of SOI substrates") disclose an overall process for producing a "semiconductor-on-insulator" (also called SeOI) structures from a donor wafer comprising in succession a single-crystal Si base support substrate, an SiGe layer and an epitaxially grown Si film bonded to an oxidized support substrate. In these disclosures, the SMARTCUT® technique is employed, creating, before bonding, a region of weakness in the Si support substrate which, after bonding, causes detachment in the donor wafer in this region. A structure consisting in succession of part of the Si support substrate, the SiGe layer and the epitaxially grown Si film is thus removed, the whole assembly being bonded to the oxidized receiving substrate.

Two successive selective etching operations are then carried out on the structure firstly to remove the remaining part of the Si support substrate with an etching solution, such that the SiGe layer forms a stop layer, and then to remove the SiGe layer with an etching solution such that the Si film forms a stop layer. The resulting structure is an SeOI structure with a surface Si layer. This silicon layer is both very thin and very uniform through its thickness, and is provided using a process which can avoid a finishing step which would otherwise be prejudicial to the quality of the silicon layer. The main objective of this process is not, however, to produce an SeOI structure with a strained silicon layer. The SiGe layer used to produce the SeOI structure during implementation of this process has a typical thickness of between 0.01 and 0.2 microns, a thickness insufficient to fulfill the role of a buffer layer between the Si support substrate and a potential relaxed SiGe layer. The silicon of the film grown epitaxially on the SiGe layer and constituting the Si layer of the final SeOI structure therefore would be little strained or unstrained, and therefore does not achieve production of a structure comprising a strained Si layer so as to benefit from its useful electrical properties, especially in SeOI structures. Also, since the instruments for implanting species are very often limited to about 200 keV, the associated maximum implantation depths would correspond substantially to the minimum thickness of a reliable buffer layer, i.e., about one to two microns, which is insufficient to implant into the Si support substrate, so it would be difficult to use this process with an SiGe layer thick enough to contain both a buffer layer and a relaxed surface SiGe layer. More powerful implantation instruments require an equipment infrastructure that would be very expensive and the operating costs could be prohibitive. This type of process therefore seems to be unsuitable for producing a structure comprising a strained Si layer.

An IBM document by L. J. Huang et al. ("*SiGe-On-Insulator prepared by wafer bonding and layer transfer for high-performance field-effect transistors*", Applied Physics Letters, 26 Feb. 2001, Vol. 78, No. 9), discloses for example a process for producing an Si/SGOI structure with strained silicon, starting from a donor wafer comprising in succession a single-crystal Si support substrate, a SiGe buffer layer and a relaxed SiGe layer. The process employed consists in using the SMARTCUT® technique in the relaxed SiGe layer, thus making it possible, after bonding to an oxidized receiving substrate and after cutting in the region of weakness created beforehand, to produce a SGOI structure with relaxed SiGe. A film of strained Si is then epitaxially grown on the relaxed SiGe layer in order to produce a Si/SGOI structure. In this final structure, a layer of relaxed material (i.e., the SiGe layer) is subjacent to the layer of strained material (i.e., the Si film). This may be prejudicial to the performance, especially the electronic performance, expected in this case of the layer of strained material, as already mentioned above. This process furthermore limits the application to the production of such a Si/SiGe-on-insulator structure and does not provide a solution to the production, for example, of a strained Si-on-insulator structure.

PCT Publication WO 01/99169 discloses processes for producing, from a wafer consisting in succession of a Si substrate, a SiGe buffer layer, a relaxed SiGe layer and, optionally, a layer of strained Si or SiGe, a final structure having the relaxed SiGe layer on the optional other strained Si or SiGe layer. The technique employed to produce such a structure involves, after bonding the wafer to a receiving substrate, removal of material from the wafer that it is not desired to retain, by selectively etching the Si substrate and the SiGe buffer layer. This technique does make it possible to achieve thin layer thicknesses having homogeneity through the thickness, but it does entail, however, the destruction of the Si substrate and of the SiGe buffer layer by chemical etching. These processes do not therefore afford the possibility of reusing part of the wafer, and especially at least part of the buffer layer, for a new layer transfer. Moreover, these processes do not provide a solution to the production of a simple strained silicon-on-insulator structure.

Accordingly, there is a need for a process to produce strained silicon-on-insulator which can overcome the above drawbacks.

SUMMARY OF THE INVENTION

The invention relates to a semiconductor wafer and a method of preparing a semiconductor wafer with a strained layer, which may have improved electrical properties. In a preferred embodiment of the method, a region of weakness configured to facilitate splitting is created in a matching layer that has a first lattice parameter. The region of weakness can be created, for example, implanting atomic species or by adding a porous layer. A strained layer of a semiconductor material is grown on the matching layer in a strained state to impart the same first lattice parameter in the strained layer as in the matching layer. A receiving substrate is associated with the strained layer to form a composite structure. Product and donor wafers are obtained by splitting the composite structure at the region of weakness. The product wafer includes the strained layer and the receiving substrate, and the donor wafer includes at least a portion of the matching layer.

The matching layer is preferably grown on a handling substrate that has a second lattice parameter that is different from the first lattice parameter, and the matching layer can include a buffer layer that is graded between the first and second lattice parameters, preferably such that the surface of the matching layer on which the strained layer is grown is substantially relaxed. Advantageously, the lattice parameter of the first material when strained is different than the lattice parameter of the first material in a relaxed state.

The receiving substrate is preferably bonded to the strained layer. Also, the strained layer is preferably disposed directly adjacent an insulator on a side of the strained layer on which the receiving substrate is disposed, and an insulator layer can be provided between the strained layer and receiving substrate. A portion of the matching layer can be retained on the strained layer after splitting. Additionally, a step to smooth roughness from the retained portion may be conducted, or the retained portion may be selectively etched from the strained layer.

The preferred material for the strained layer is Si, and for the matching layer is SiGe. Additionally, the region of weakness is preferably formed prior to growing the strained layer.

In the preferred embodiment, the strain imparted to the strained layer is sufficient for modifying the energy band structure of the strained layer material for improving the electrical properties thereof compared to the material in a relaxed state. The strained layer has a thickness that is sufficiently thin to prevent substantial relaxation of the strain. This thickness is preferably less than about 20 nanometers. The resulting charge carrier mobility in the strained semiconductor material layer is at least about 50% higher than in the same semiconductor material in a relaxed state.

In one embodiment, a strain-retaining layer having the first lattice parameter can be provided on the strained layer in association therewith for maintaining the strain from the side of the strained layer opposite the receiving substrate. The matching and strain-retaining layers can be made of substantially the same material.

In another embodiment, a second strained layer of a semiconductor material is provided on the first strain-retaining layer to impart the first lattice parameter therein. This enables the second strained layer to be transferred to a second receiving substrate after creating a weakened region in the first strain-retaining layer, and the first strained layer to be transferred to a first receiving substrate, such as after the transfer of the second strained layer. A second strain-retaining layer can be provided on the second strained layer substantially with the first lattice parameter for maintaining the strained state of the second strained layer from the side of the second strained layer opposite the first strain-retaining layer.

The second receiving substrate can be associated with the strained layers to form a second composite structure, and a second product wafer and a second donor wafer can be obtained by splitting the second composite structure at the second region of weakness. Preferably, the second product wafer includes the second strained layer and the second receiving substrate, while the second donor wafer includes at least a portion of the first strain-retaining layer. The first region of weakness can be created in the first strain-retaining layer, and the first receiving substrate can be associated with the second donor wafer to form the first composite structure. In this embodiment, a first product wafer and first donor wafer are obtained by splitting the first composite structure at the first region of weakness. The first product wafer preferably includes the first strained layer and the first receiving substrate, while the first donor wafer includes at least a portion of the matching layer.

A semiconductor wafer of a preferred embodiment of the invention includes a matching layer having a first lattice parameter and a strained layer of a semiconductor material grown on the matching layer in a strained state to impart the same first lattice parameter in the strained layer as in the matching layer. The wafer also has a strain-retaining layer grown on the strained layer in a substantially relaxed state and having the same first lattice parameter for maintaining the strained state of the strained layer from the side of the strained layer opposite the receiving substrate.

In one embodiment, a second strained layer is disposed on the first strain-retaining layer and is strained to impart the first lattice parameter therein. A second strain-retaining layer is on the second strained layer in a substantially relaxed state and has the first lattice parameter for maintaining the strained state of the second strained layer from the side of the second strained layer opposite the first strain-retaining layer.

A repeating pattern of first and second layers can be provided, such as on the matching layer. This preferably allows for performing multiple transfers of a portions of the pattern to a receiving substrate to produce product wafers, with each portion including at least one of the first layers.

An oxide of the material of the first strained layer can be bonded thereto as the strain retaining member before splitting. Preferably, the first strained layer comprises silicon, and the method further comprising bonding silica to the silicon of the first strained layer prior to splitting. Additionally, the transferred strained layer of portion thereof remaining thereof can be thickened epitaxially to produce a thicker strained layer.

BRIEF DESCRIPTION OF THE DRAWINGS

Further aspects and advantages of the present invention will be more clearly apparent on reading the following detailed description of the implementation of preferred processes thereof, these being given by way of non-limiting example and with reference to the appended drawings, in which:

FIGS. 5a-g show various steps of a fifth process for producing an electronic structure from a stack of strained semiconductor layers.

DETAILED DESCRIPTION FOR THE PREFERRED EMBODIMENTS

Figure 1A:
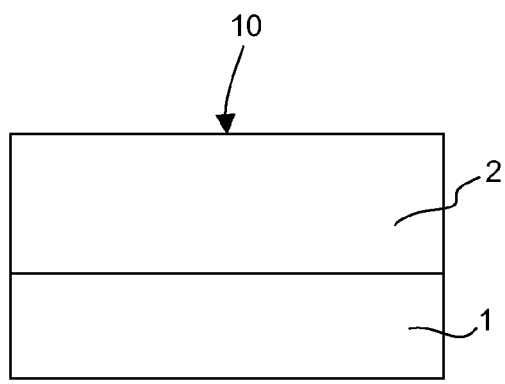
FIGS. 1a-d show various steps of a first process for producing an electronic structure comprising a thin layer of strained silicon according to the invention.
Figure 1B:
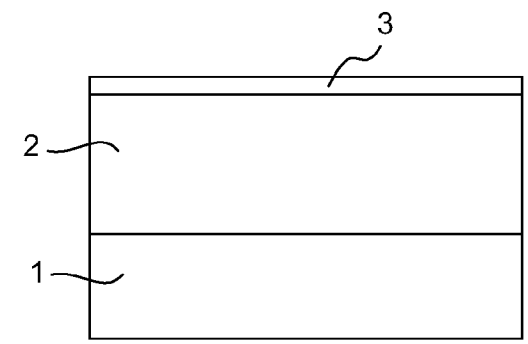

The expression "strained layer" is understood here to mean any layer of a semiconductor material with a crystallographic structure that is strained in tension or in compression during crystal growth, such as during epitaxy, with at least one lattice parameter that is substantially different from the nominal lattice parameter of this material. Conversely, the term "relaxed layer" means any layer of a semiconductor material which has an unstrained crystallographic structure. That is to say, one which has a lattice parameter substantially identical to the nominal lattice parameter of the material of the layer.

The invention aims to produce an SeOI structure. The strain exerted within the semiconductor material of the produced SeOI may in fact exhibit physical and/or electrical properties worthwhile exploiting. Thus, for example, a main benefit of tension-strained silicon layers (also called strained Si layers) consists mainly in the fact that the charge carriers (such as holes and electrons) have a higher mobility than that usually found in relaxed Si layers. The strained Si layers may in this regard reach a charge carrier mobility 100% higher than that within relaxed Si layers, and preferably the charge carrier mobility is at least about 50% higher.

To produce such strained Si layers, it is known to grow a silicon film by epitaxy on a base composed of silicon and germanium. Since germanium in equilibrium has a lattice parameter slightly greater than that of the silicon in equilibrium (greater by approximately 4%), the presence of germanium in a defined amount in the silicon thus makes it possible to slightly increase the lattice parameter compared with a base consisting only of silicon. This silicon-germanium base (also called SiGe base) will thus strain the epitaxially grown Si film so as to make its lattice parameter substantially identical to its own.

In practice, a substrate made of bulk SiGe is not available on the market and the SiGe base is then generally composed of a single-crystal Si support substrate on which a relaxed SiGe layer is produced via a buffer layer. The term "buffer layer" is understood to mean an intermediate layer between two crystallographic structures with different lattice parameters, having in the region of one of its faces a lattice parameter substantially identical to that of the first structure and in the region of its other face a lattice parameter substantially identical to that of the second structure. The buffer layer inserted between the Si support substrate and the relaxed SiGe layer is generally made of SiGe, with a quantity-wise proportion of germanium which progressively increases through the thickness of the support substrate towards the relaxed layer.

Thus, the buffer layer has a thickness sufficient to make it possible to:

to gradually increase the germanium content from the support substrate towards the relaxed layer;

to confine defects associated with the difference in lattice parameter so that they are buried; and to give a sufficiently thick relaxed SiGe layer stability with respect to an Si film grown epitaxially on its surface in order to strain the latter so as to modify its lattice parameter without influencing that of the relaxed SiGe layer. The thickness of the buffer layer is preferably about between one and three microns.

In the field of application of the present invention, this type of wafer is used as a donor in the sense that at least a layer of material is removed therefrom in order to transfer it to a receiving substrate. This transfer generally comprises a first step of bonding the donor wafer to the receiving substrate. A second step consists in keeping of the bonded donor wafer only at least one thin layer adjacent to the bonding region, by removing the superfluous parts from the donor wafer.

The preferred process of the invention for producing an electronic structure comprising a thin layer of strained semiconductor material from a donor wafer comprising a lattice parameter matching layer comprising an upper layer of semiconductor material having a first lattice parameter, includes the following steps:

(a) growth of a film of semiconductor material on the upper layer of the matching layer, which film has a second, nominal, lattice parameter substantially different from the first lattice parameter, with a thickness small enough to keep the first lattice parameter of the upper layer of the subjacent matching layer and thus to be strained;

(b) formation of a region of weakness in the wafer on the matching layer side in relation to the film, the location of which in each of the following embodiments is shown at 7 in FIGS. 1c, 2c, 3d, and 4d;

(c) bonding of a receiving substrate with the donor wafer on the film side; and (d) removal of at least part of the donor wafer on the matching layer side in relation to the film, comprising supply of energy into the region of weakness in order to detach a structure which includes the relaxed layer from the wafer.

Additionally, embodiments of the invention include the following aspects:

in step (d) relates substantially the entire portion of the donor wafer disposed on the same side of the film as the matching layer can be removed;

step (d) can be carried out so as not to remove part of the donor wafer on the side of the film where the matching-layer is disposed, and this unremoved portion can include part of the matching layer close to the film. In this case, a process for correcting the surface roughness may be carried out on the surface of the unremoved portion of the matching layer;

after step (a), a step of growing at least one growth layer on the film can additionally be carried out, and preferably the growth layer does not substantially decrease the strained state of the film. In the latter case, the growth layer preferably has a nominal lattice parameter substantially identical to the first lattice parameter;

after step (a), steps of growing, on the film, layers not substantially decreasing the strained state of the film can be carried out. These growth layers preferably form a multilayer structure having a layer having the first lattice parameter and a strained layer made of semiconductor material having a nominal lattice parameter substantially different from the first lattice parameter. The growth layer directly adjacent to the film is preferably a layer having the first lattice parameter;

between step (a) and step (c), a step of forming at least one bonding layer between the receiving substrate and the donor wafer can be additionally carried out, with the bonding layer formed on the receiving substrate and/or on the bonding face of the donor wafer. The bonding layer can be made of silica;

the bonding may carried out by molecular adhesion (wafer bonding);

the bonding is preferably accompanied by a heat treatment in order to strengthen the bonds;

the region of weakness is preferably formed by implantation of atomic species into the matching layer at a depth substantially equal to the implant depth;

before step (a), the region of weakness can be formed by porosification of a layer beneath the film;

step (d) can comprise, after the energy supply operation of step (d), an operation of selectively etching the material having the first lattice parameter with respect to the material constituting the film in order to remove the remainder of the matching layer;

the preferred film of strained material is made of silicon and the preferred matching layer is made of silicon-germanium, the matching layer comprising a buffer layer with a germanium concentration that increases through the thickness and the upper layer which is relaxed beneath the strained film. If part of the matching layer remains after removal during step (c), this part of the matching layer is preferably at least part of the upper relaxed silicon-germanium layer of the matching layer; in either of the two immediately preceding cases, and if a growth layer has been grown on the film, this growth layer is preferably made of relaxed silicon-germanium, with a germanium concentration substantially equal to the germanium concentration of the relaxed upper layer of the matching layer;

the receiving substrate can be made of silicon;

the wafer preferably comprises at least one layer furthermore containing carbon, with a carbon concentration in the layer substantially less than or equal to 50%; and the wafer (10) preferably comprises at least one layer furthermore containing carbon, with a carbon concentration in the layer substantially less than or equal to 5%.

The invention provides semiconductor-on-substrate structures, which can be produced in accordance with the above process. Preferably, the thickness of semiconductor of the structure includes:

the film; or part of the matching layer on the film; or the film on the growth layer having a nominal lattice parameter substantially identical to the first lattice parameter; or the film on a multilayer structure; or part of the matching layer on the film on the growth layer having a nominal lattice parameter substantially identical to the first lattice parameter; or part of the matching layer on the film on a multilayer structure;

and there is a layer of electrically insulating material beneath the thickness of the semiconductor of the structure, so that the structure is a semiconductor-on-insulator structure.

The present invention provides a reliable process for transferring a film of strained material from a donor wafer to a receiving substrate, the assembly then forming the desired electronic structure, without relaxing the strain within the film during transfer. An example of a process according to the invention will now be described below with reference to FIGS. 1a, 2a, 3a and 4a from a donor wafer 10 consisting in the first place of a single-crystal silicon support substrate 1 and an SiGe lattice parameter matching layer 2. The expression "lattice parameter matching layer" denotes any structure behaving as a buffer layer. In the preferred embodiment, the matching layer has, on the surface, a layer of substantially relaxed material without an appreciable number of structural defects, such as dislocations.

Thus, in our example, it will be advantageous to choose an SiGe matching layer 2 consisting in succession of a SiGe buffer layer and a relaxed SiGe layer on the surface. The buffer layer preferably has a germanium concentration which grows uniformly from the interface with the support substrate 1, for reasons which were explained above. Its thickness is typically between 1 and 3 micrometers in order to obtain good structural relaxation on the surface. The relaxed SiGe layer has advantageously been formed by epitaxy on the surface of the buffer layer and its thickness may vary widely depending on the case, with a typical thickness of between 0.5 and 1 micron.

The germanium concentration in the silicon within the relaxed SiGe layer is typically about between 15% and 30% in order to obtain, during the next step (shown by FIGS. 1b, 2b, 3b or 4b), an epitaxially grown Si film 3 sufficiently strained in order to have appreciable electrical properties and not too strained so as to prevent internal structural defects from appearing. This 30% upper end represents a typical maximum used in the current techniques, but this upper end may increase in the coming years and in other processes.

With reference to FIGS. 1b, 2b, 3b and 4b, an Si film 3 is grown on the SiGe matching layer 2. The Si film 3 is advantageously formed by epitaxy using known techniques such as CVD (chemical vapour deposition) and MBE (molecular beam epitaxy) techniques. The silicon lying within the film 3 is then obliged by the matching layer 2 to increase its nominal lattice parameter in order to make it substantially identical to that of its growth substrate and thus introduce internal tensile strains.

These modifications of its internal crystallographic structure will increase the mobility of the charge carriers (such as holes and electrons) by modifying the energy band structure of the silicon crystal. The electrical properties desired in this invention are thus obtained. It is desired, however, to form quite a thin Si film 3, as too great a film thickness could cause at least partial relaxation of the strain in the thickness of the film towards the nominal lattice parameter of the silicon. The thickness of the film 3 is thus typically less than about 20 nanometers, and preferably about between 10 and 20 nanometers. Above about 20 nanometers there is a risk of substantial relaxation of the strain that is desired in the present invention, and below about 10 nanometers there is a risk of the thickness of the film causing problems in the fabrication of certain electronic components.

Once this donor wafer 10 containing a strained Si film 3 has been produced, one difficulty resides in implementing a reliable process for transferring the strained film 3 from the donor wafer 10 onto a receiving substrate 4, the whole assembly then forming the desired electronic structure 20 without any relaxation of the strain within the film 3 during transfer. To solve this particular difficulty, several methods of implementation may be suggested.

Figure 1C:
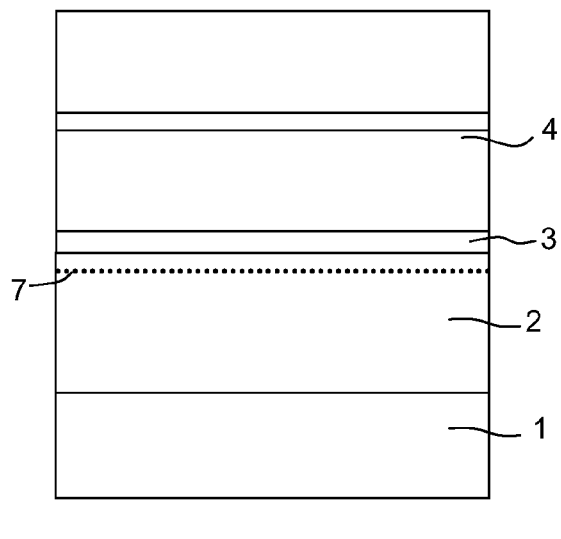
Figure 2A:
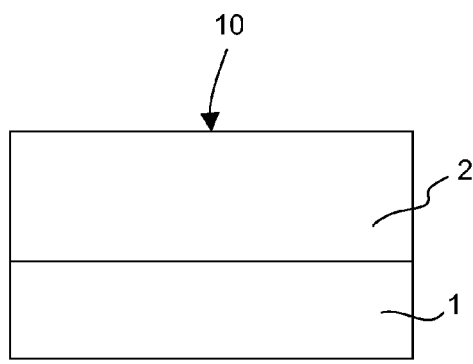
FIGS. 2a-d show various steps of a second process for producing an electronic structure comprising a thin layer of strained silicon according to the invention.
Figure 2B:
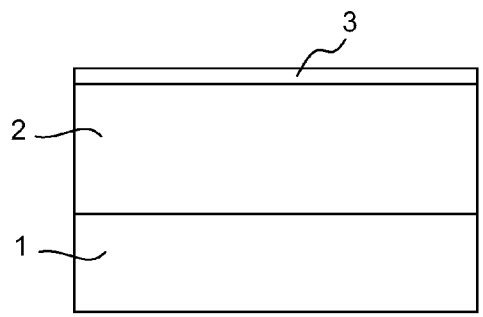
Figure 2C:
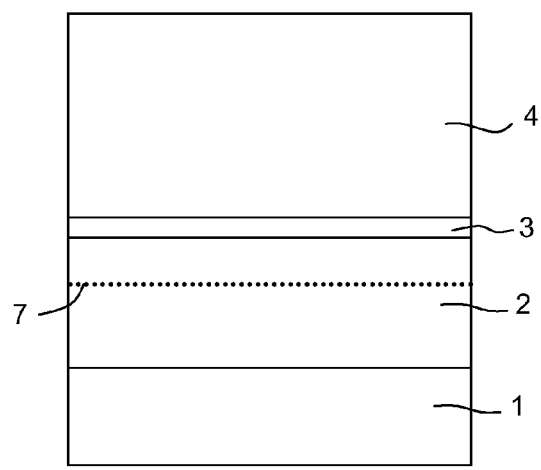

In a first method of implementing the process according to the invention, with reference to FIGS. 1c and 2c, a receiving substrate 4 is attached to the surface of the strained film 3. This receiving substrate 4 may, for example, be made of silicon or may consist of other types of material. The receiving substrate 4 is attached by bringing it into intimate contact with the strained Si film 3 and carrying out bonding, in which molecular adhesion between the substrate 4 and the film 3 is advantageously effected. This bonding technique, as well as variants, is for example described in the document entitled "*Semiconductor Wafer Bonding*" (Science and Technology, Interscience Technology) by Q. Y. Tong, U. Gösele and Wiley.

If necessary, bonding is accompanied by an appropriate prior treatment of the respective surfaces to be bonded and/or by supplying thermal energy and/or supplying an additional tie layer. Thus, for example, a heat treatment carried out during bonding allows the bonds to be strengthened.

Bonding may also be reinforced by a bonding layer inserted between the film 3 and the receiving substrate 4, which makes it possible to produce molecular bonds both with the film 3 and with the material constituting the bonding face of the receiving substrate 4 which are stronger than those existing between the film 3 and the receiving substrate 4.

Silicon oxide (also called silica or $SiO_2$) is a material that may be chosen for producing such a bonding layer, as it exhibits good adhesion with the silicon of the film 3. The silica may be formed on the film 3 and/or on the receiving substrate 4 by $SiO_2$ deposition or by thermal oxidation on the respective bonding surfaces.

Preferably, the material constituting the bonding face of the receiving substrate 4 and/or the material of the bonding layer optionally formed is electrically insulating, so that there exists an insulating layer directly adjacent to the strained Si film 3. A conducting or semiconducting material directly adjacent to the film 3 could impair the electrical effects desired here in a structure consisting of the combination of the two materials. This advantageous choice of insulating material adjacent to the film 3 becomes particularly useful when the structure 20 that it is desired to produce in the end is an SeOI structure, the semiconductor layer of the SeOI structure then being the transferred film 3 of strained Si. Moreover, the receiving substrate 4 bonded to the strained Si film 3 makes it possible to retain substantially the strained structural state of the strained Si of the film 3, this being so even if the donor wafer 10 on which the strained Si film 3 has been grown epitaxially is removed, the strain within the film 3 being mainly ensured after transfer by the bonding forces existing between the film 3 and the receiving substrate 4.

Transfer of the strained film 3 from the donor wafer 10 to the receiving substrate 4 without relaxing the strain within the film 3 is thus made possible, thereby solving the abovementioned difficulty.

The receiving substrate 4 preferably provides mechanical support sufficiently rigid to sustain the strained Si film 3 and protect it from any mechanical stresses coming from the outside. Once the receiving substrate 4 has been bonded, part of the donor wafer 10 is removed using one or more of the preferred techniques that will be explained later, in order to transfer the strained Si film 3 to the receiving substrate and to produce the desired structure 20.

Figure 1D:
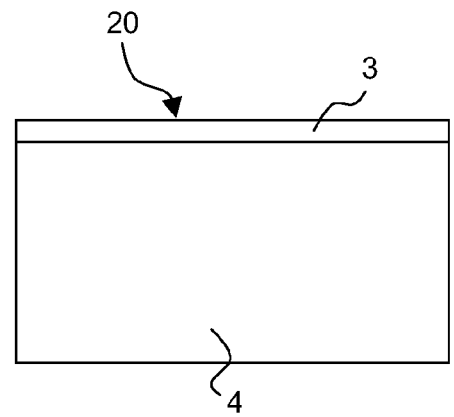

In a first case, with reference to FIG. 1d, substantially all that part of the donor wafer 10 on the matching layer 2 side in relation to the strained film 3 is removed. Thus, a final strained Si-on-substrate structure, and in particular a strained Si-on-insulator structure (also called here an SOI structure), is obtained if the material subjacent to the strained Si film 3 is an electrical insulator.

Figure 2D:
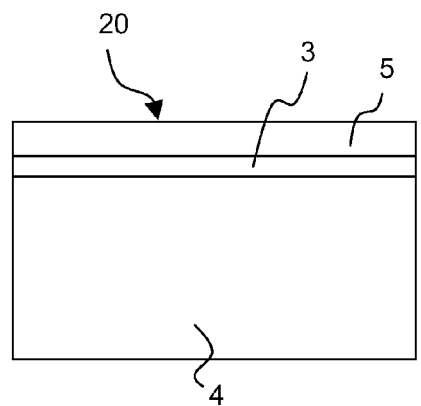

In a second case, with reference to FIG. 2d, the support substrate 1 and part of the matching layer 2 are removed. Thus, a final SiGe-on-strained Si-on-substrate structure, and in particular an SiGe-on-strained Si-on-insulator structure (also called SiGe/SOI structure), is obtained if the material subjacent to the strained Si film 3 is an electrical insulator. The removal of part of the matching layer 2 is advantageously carried out so as to preserve of the matching layer 2 on the structure 20 only at least part of the relaxed SiGe layer present in the matching layer 2 (and which had been epitaxially grown according to one particular method of producing the matching layer 2 explained above, on a buffer layer).

Figure 3A:
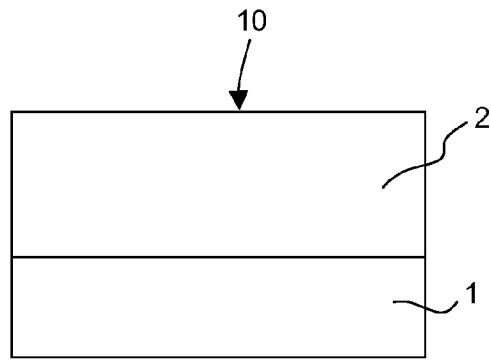
FIGS. 3a-e show various steps of a third process for producing an electronic structure comprising a thin layer made of strained silicon according to the invention.
Figure 3B:
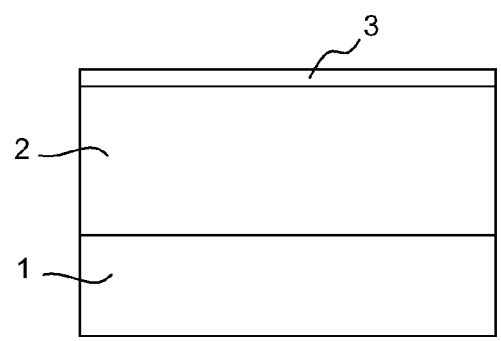
Figure 3C:
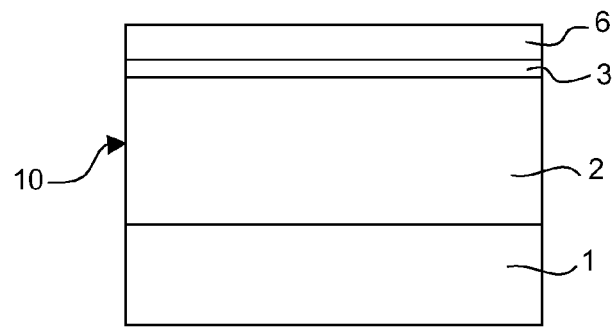
Figure 4A:
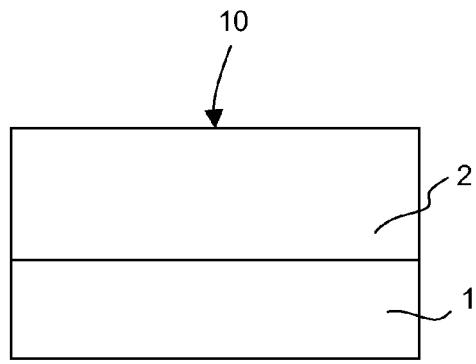
FIGS. 4a-e show various steps of a fourth process for producing an electronic structure comprising a thin layer of strained silicon according to the invention.
Figure 4B:
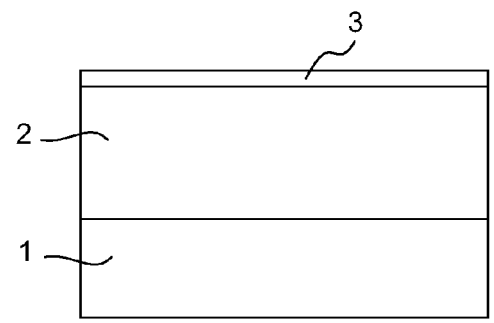
Figure 4C:
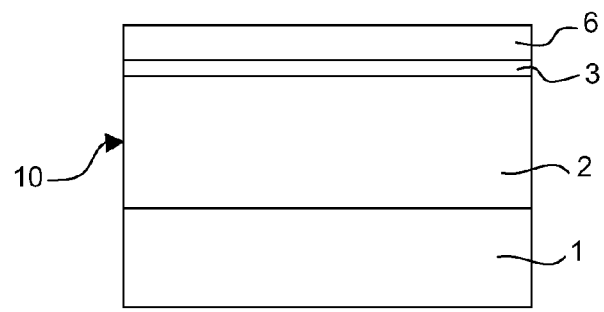

According to a second method of implementing the process according to the invention, with reference to FIGS. 3c and 4c, a relaxed SiGe layer 6 is grown on the strained Si film 3, by epitaxy (for example by CVD or MBE) advantageously before any bonding operation. The Ge concentration in this layer 6 is advantageously and substantially the same as that of the SiGe present near the bonding face of the matching layer 2 so as to prevent this layer having an additional influence on the strain in the film 3.

In one particular method of implementation, further layers may be grown epitaxially on the SiGe layer, such as strained Si or SiC layers and SiGe or SiGeC layers respectively alternating in order to form a multilayer structure.

Figure 3D:
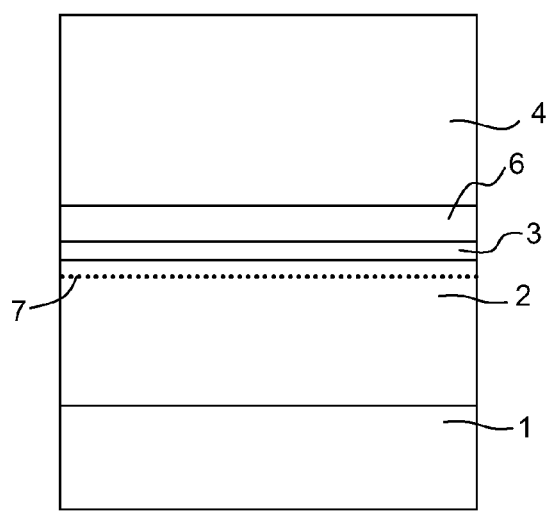
Figure 4D:
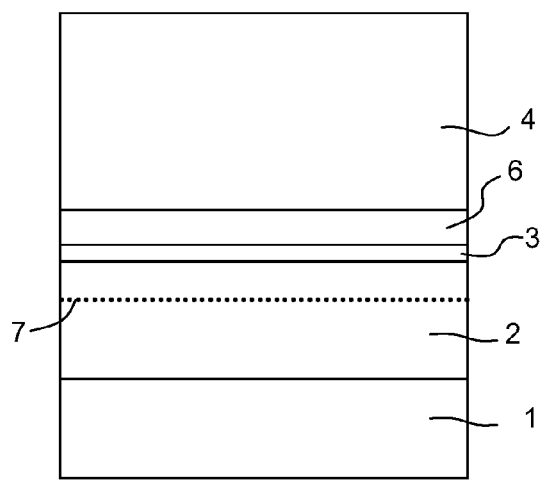

Referring to FIGS. 3d and 4d, a receiving substrate 4 is bonded to the relaxed SiGe layer 6 in a manner substantially identical to that explained above in the first method of implementation and relating to a receiving substrate 4 bonded to the strained film 3. The bonding face of the donor wafer 10 is then the free face of the relaxed SiGe layer 6.

It should be pointed out that, unlike the first method of implementation, the bonds do not necessarily constitute the only means of preserving the strain in the film 3. This is because if the relaxed SiGe layer 6 is thick enough, it may participate in or even cause the preservation of the strain in the film 3 after these two layers have been transferred. The thickness of the SiGe epilayer 6 may thus be judiciously chosen in this regard so as to preserve greater or lesser amounts of the strain in the Si layer.

Figure 3E:
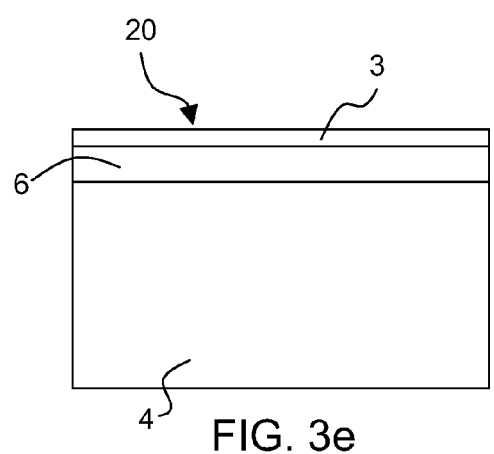

As in the first method of implementation, once the receiving substrate 4 has bonded, part of the donor wafer 10 is removed using one or more of the preferred techniques that will be explained below, in order to transfer the strained Si film 3 to the receiving substrate 4 and produce the desired structure 20. In a first case, with reference to FIG. 3e, all that part of the donor wafer 10 on the matching layer 2 side in relation to the layer 6 is removed. Thus, a final strained Si-on-relaxed SiGe-on-substrate structure, and in particular a strained Si-on-relaxed SiGe-on-insulator structure (also called an Si/SGOI structure), is obtained if the material subjacent to the relaxed SiGe layer 6 is an electrical insulator.

Figure 4E:
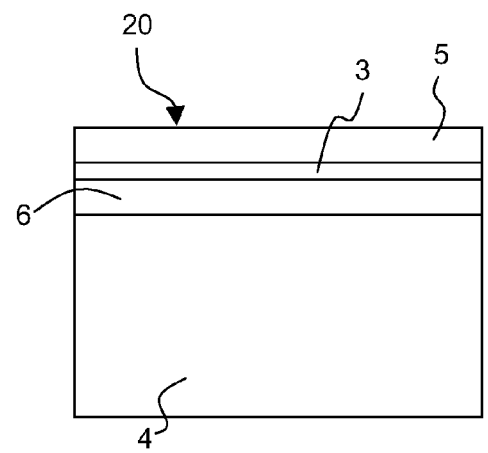

In a second case, with reference to FIG. 4e, the Si support substrate 1 and part of the matching layer 2 are removed. Thus, a final SiGe-on-strained Si-on-relaxed SiGe-on-substrate structure, and in particular an SiGe-on-strained Si-on-relaxed SiGe-on-insulator structure (also called an SiGe/Si/SGOI structure), is obtained if the material subjacent to the relaxed SiGe layer 6 is an electrical insulator. Part of the matching layer 2 is advantageously removed so as to preserve of the matching layer 2 on the structure 20 only at least part of the relaxed SiGe layer present in the matching layer 2 (and which had been epitaxially grown, using one particular method of producing the matching layer 2 explained above, on a buffer layer).

Thus, by means of the process according to the invention several structures (shown for example in FIGS. 1d, 2d, 3e and 4e) comprising a layer of strained material can be produced, each having very specific electrical properties.

With reference to FIGS. 1d, 2d, 3e and 4e, removal of material constitutes the final step of producing such structures. A first material removal operation consists in cutting the donor wafer in a region of the matching layer 2 that has previously been weakened therein. The techniques for perform such an operation include the following two known techniques.

A first technique, called the SMARTCUT® technique, known to those skilled in the art (and descriptions of which may be found in a number of works dealing with wafer reduction techniques), consists in implanting atomic species (such as hydrogen ions) and then in subjecting the implanted region, which then forms a region of weakness, to a heat treatment and/or mechanical treatment, or another supply of energy, in order to make the cut in the region of weakness. Cutting a region of weakness thus formed in the matching layer 2 makes it possible to remove most of the wafer 10, in order to obtain a structure comprising the remainder of the matching layer 2, the strained Si film 3, optionally epitaxially grown overlayers such as the layer 6, the optional bonding layer and the receiving substrate 4.

A second technique consists in obtaining a weak interface by creating at least one porous layer, as described for example in document EP-A-0 849 788, and then in subjecting the weak layer to a mechanical treatment, or another supply of energy, in order to make the cut in the weakened layer. The weakened layer made of porous silicon is formed within the support substrate 1, between the support substrate 1 and the matching layer 2, in the matching layer 2 (for example between a buffer layer and a relaxed layer) or on the matching layer 2 (that is to say between the matching layer 2 and the strained Si film 3 or the optional relaxed SiGe layer 6).

To form a weakened layer within the support substrate 1, the porous layer is preferably advantageously grown on a single-crystal Si support substrate, and then a second growth is carried out on the porous layer so as to grow a non-porous Si layer having substantially the same lattice parameter as the Si of the support substrate. The support substrate 1 then consists of the support substrate, the porous layer and the non-porous Si layer.

Cutting a weakened layer makes it possible to remove at least some of the wafer 10 to obtain a structure comprising the optional remainder of the wafer 10, the strained Si film 3, optionally epitaxially grown overlayers such as the layer 6, optionally the inserted bonding layer and the receiving substrate 4.

A treatment of the wafer 10, in order to remove the porous silicon which remains after the cutting, is advantageously carried out, such as an etching operation or a heat treatment. If the porous layer lies within the support substrate 1, a lapping, chemical-mechanical polishing and/or selective chemical etching operations are then advantageously carried out in order to remove the remaining part of the support substrate 1.

These two techniques or other suitable techniques make it possible to rapidly remove, en bloc, a substantial part of the wafer 10. They also allow the possibility of reusing the removed part of the wafer 10 in another process, such as for example a process according to the invention.

Thus, if the part removed is the support substrate 1, an operation to reform a matching layer 2, a film 3 and an optional SiGe layer 6 and/or other layers may be carried out as described above, after the surface of the support substrate 1 has been polished. If the removed part is the support substrate 1 and at least part of the matching layer 2, a possible reformation of another part of the matching layer 2, of a film 3 and of an SiGe layer 6 and/or other layers may be carried out as described above, after the surface of the remaining part of the matching layer 2 has been polished.

A second material removal operation after cutting the wafer 10 according, for example, to one of the above two techniques can include correcting surface defects or in removing, if necessary, the remaining part of the matching layer 2. If it is desired to remove all of the remaining part of the matching layer 2 (referring to FIGS. 1d and 3e), this operation may be carried out by selective chemical etching so that the strained Si film 3 undergoes little or no etching, thus forming an etching stop layer.

The remaining part of the matching layer 2 is in this case etched by wet etching using etching solutions having a substantial selectivity with respect to the strained Si film 3, such as a solution comprising $HF/H_2O_2/CH_3COOH$ (approximately $1/1000$ selectivity) or HNA (hydrofluoric-nitric-acetic solution). Dry etching operations may also be carried out in order to remove material, such as plasma etching, or by sputtering. This chemical method has the main advantage of being quite rapid for thin layers to be removed and of avoiding the use of chemical-mechanical polishing finishing operations usually employed after cutting the wafer.

It thus makes it possible to maintain good surface quality and good thickness homogeneity of the strained Si film 3 obtained during its epitaxy, it preferably having been unnecessary to carry out a mechanical finishing step in the case in which the material removal is completed by a single chemical operation, thus preventing defects from appearing, such as strain-hardened regions, that such a mechanical finishing step is likely to cause. In certain particular cases, gentle polishing is, however, used in order to compensate for any small surface roughnesses.

The chemical etching operation may advantageously be preceded, especially in the case of a thick layer to be removed, by mechanical or chemical-mechanical abrasion by lapping and/or chemical-mechanical polishing CMP of the remaining part of the matching layer 2. If it is desired to maintain part of the matching layer 5 (referring to FIGS. 2d and 4e), it will be advantageous to choose a heat treatment or a polishing, preferably chemical-mechanical polishing CMP, in order to remove any roughnesses and thickness homogeneities that might have appeared during cutting of the wafer 10. Etching selectivity with respect to the Ge concentration present in the matching layer 2 (and which increases with the thickness of the matching layer 2) may also be employed, however, the etching slowing down or stopping on the relaxed layer lying within the matching layer 2. Wet etching with a solution comprising TMAH may, for example, be very suitable for carrying out such selective etching, where the relaxed layer of the matching layer 2 has a germanium concentration of about between 20% and 30%. The invention covering other types of techniques as well that are suitable for removing material from a donor wafer 10 in accordance with the process according to the invention.

In one particular embodiment of the structure of the product wafer 20, one or more epitaxial depositions may be carried out on the donor wafer 10, such as epitaxial deposition of an SiGe or SiGeC layer, or epitaxial deposition of a strained Si or SiC layer, or successive epitaxial depositions of SiGe or SiGeC layers and strained Si or SiC layers in alternation, in order to form a multilayer structure.

Having completed the final structure, a finishing step may optionally be carried out, such as finishing treatments, for example like an annealing operation in order to further strengthen the bonding interface between the donor wafer 10 and the receiving substrate 4.

Although the preferred embodiment of the present invention has a SiGe lattice parameter matching layer 2, other embodiments have a matching layer 2 made from other types of type III-V materials or other materials capable of straining the material of the epitaxially overgrown film 3 or another semiconductor material.

Figure 5A:
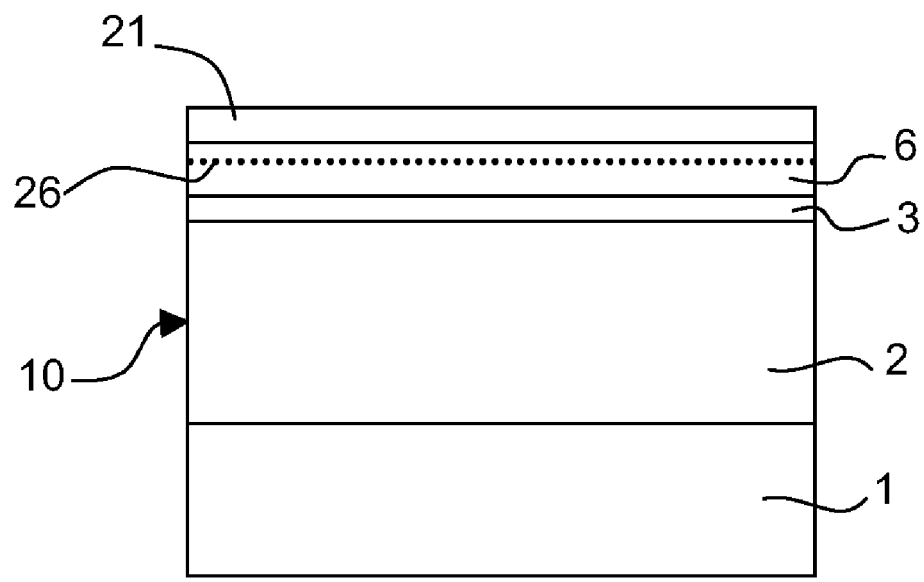

Referring to FIGS. 5a-g and 6a-c, other embodiments of the invention for producing multiple product wafers are shown. After steps as described with regard to FIGS. 4a-4c, a second strained layer 21 of semiconductor material is grown on a first strain-retaining layer 6, as shown in FIG. 5a, to impart the lattice parameter of the strain-retaining layer 6 in the second strained layer 21, which is preferably substantially the same as the lattice parameter of the matching layer 10 and first strained layer 3 in the strained state. A region of weakness 26 can be formed at this stage, as described above, in the first strain-retaining layer 6, such as by implantation through the second strained layer 21.

Figure 5B:
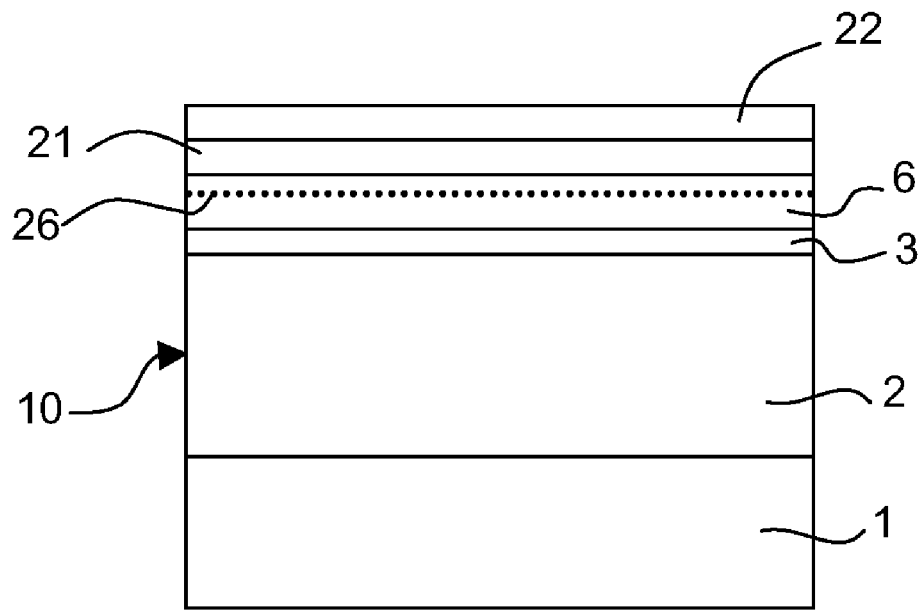

In one embodiment, shown in FIG. 5b, a second strain-retaining layer 22 is provided, such as by growing, on the second strained layer 21. The second strain-retaining layer 22 has the first lattice parameter for maintaining the strained state of the second strained layer 21 from the side of the second strained layer 21 opposite the first strain-retaining layer 6. A second receiving substrate 23 is then preferably associated with the strained layers 3,21, such as by bonding the second receiving substrate 23 to the second strain-retaining layer 22.

Figure 6A:
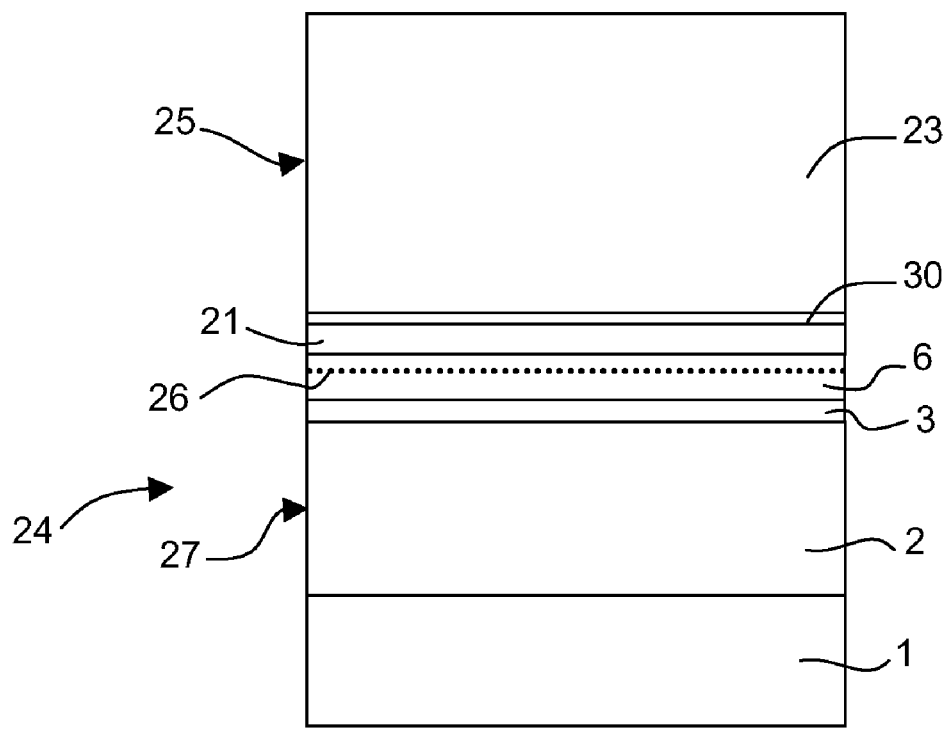
FIGS. 6a-c show various steps of a sixth process for producing an electronic structure from a stack of strained semiconductor layers.

In another embodiment, which is shown in FIG. 6a, the second receiving substrate 23 is associated with the strained layers 3,21 by bonding directly to the second strained layer 21, as no strain-retaining layer is provided between the second strained layer 21 and the second receiving substrate 23. An insulating layer can also be added at 30, such as by oxidizing the top surface of the one or more of the strained layers 21,3 or by depositing oxides thereon, preferably prior to the association with the receiving substrate 23 or growth of layer 6, respectively. An oxidized layer 30 is shown in FIG. 6a. A similar insulator can be added, for example, between any of the strained layers in the various embodiments of the invention and adjacent layers.

Figure 5C:
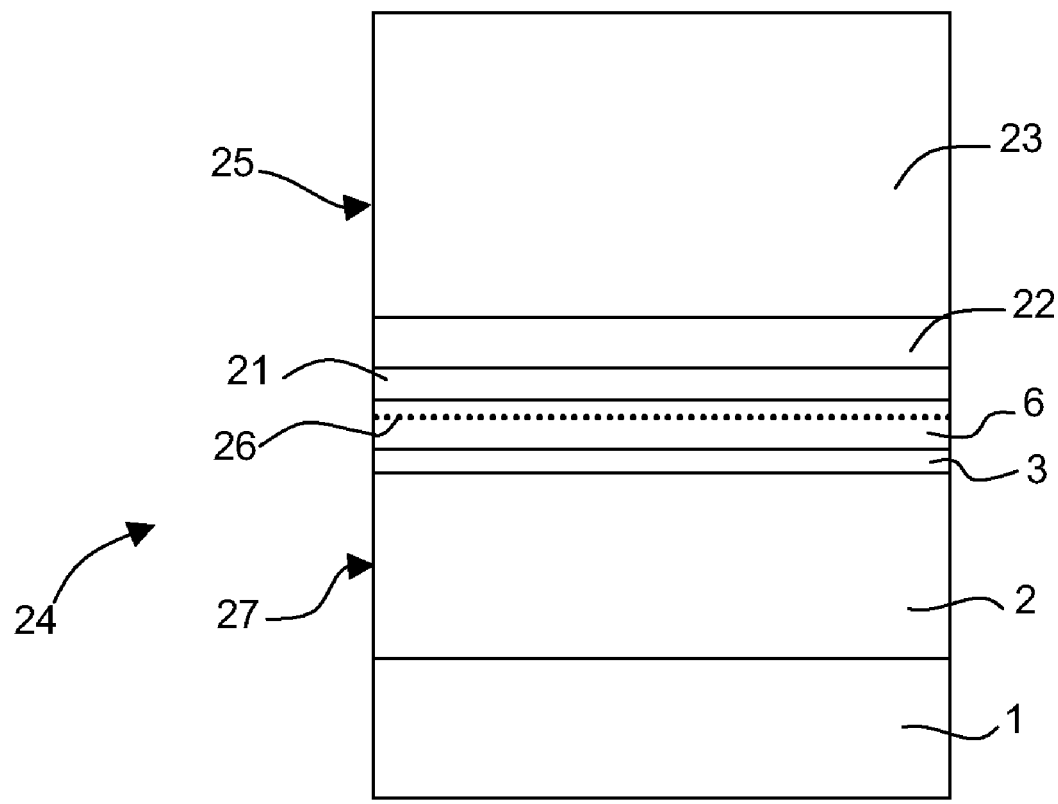
Figure 5D:
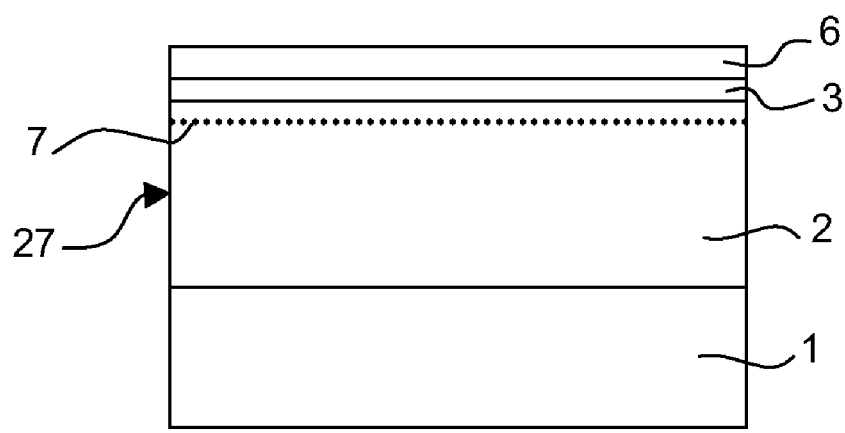

The stack of multiple strained layers interposed with at least one strain-retaining layer permits multiple transfers from different parts of the collective donor wafer. The second strained layer 22 is transferred to the second receiving substrate 23 by splitting at the region of weakness 26 the composite structure 24 thus created into a second product wafer 25 and a second donor wafer 27 by splitting the composite structure 24. The second product wafer 25 in this embodiment includes the second strained layer 21 and the second receiving substrate 23, and the second donor wafer 27 includes at least a portion of the first strain-retaining layer 6. In the embodiment of FIGS. 5c-5e, the second strain-retaining layer 22 is part of the second product wafer 25.

Figure 6B:
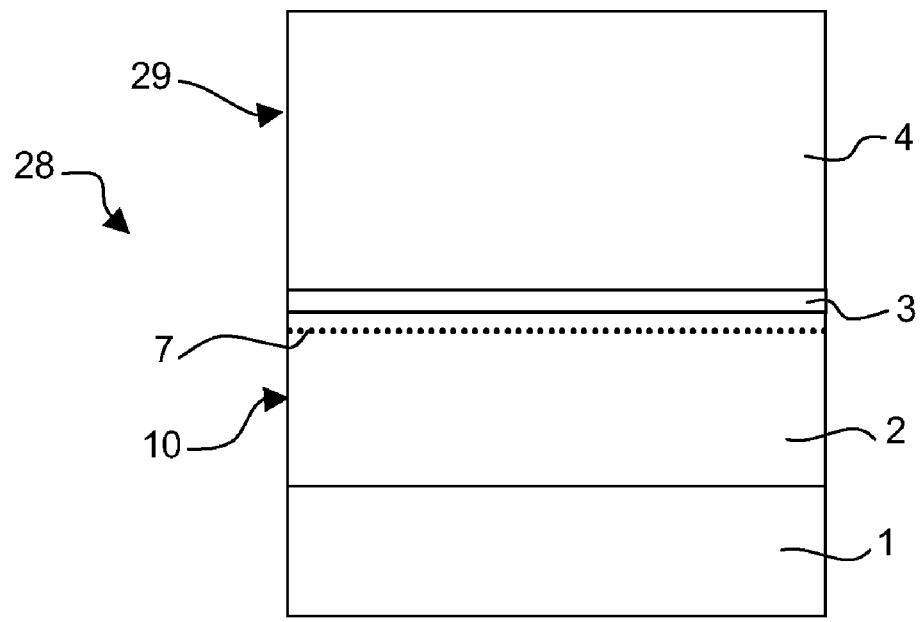
Figure 6C:
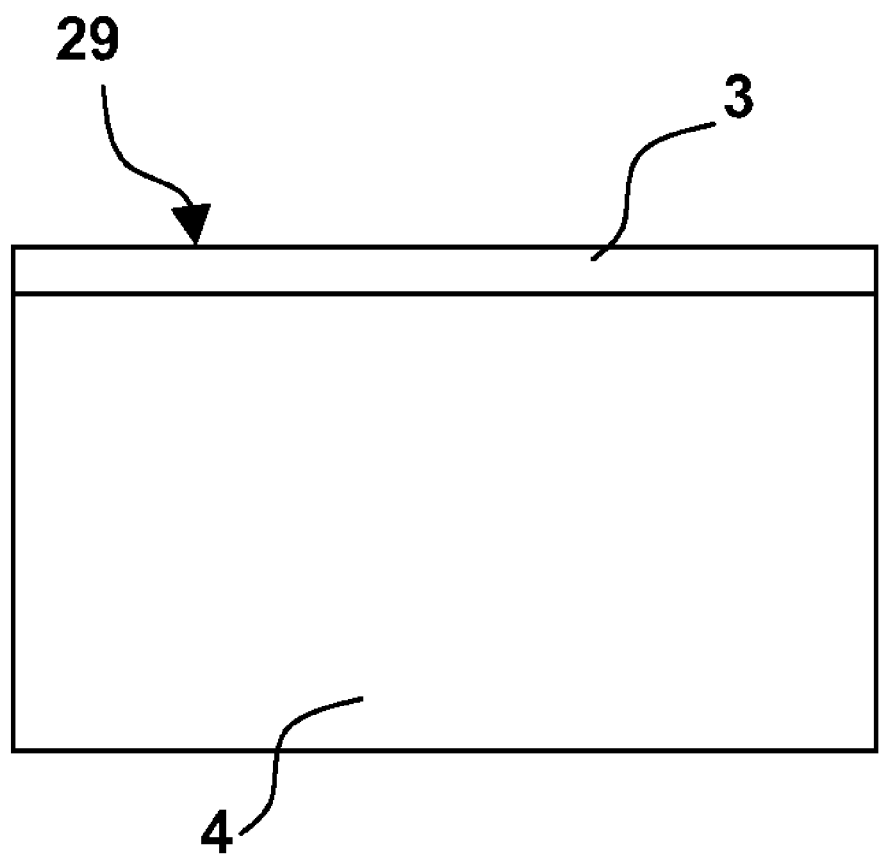

A weakened region 7 can be formed in the matching layer 2, which is preferably accomplished at this stage, as shown in FIG. 5d, although it can be accomplished at other points in the process. Referring to FIGS. 5f and 6b, a first receiving substrate 4 is associated with the first strained layer 3, either directly or with a strain-retaining layer therebetween. The strain-retaining layer that is therebetween in FIG. 5f can be the remaining portion of the first strain-retaining layer 6 which may be etched or otherwise smoothed. The remaining portion of the strain retaining layer on the second donor wafer 27 can alternatively be completely removed, such by etching. The first strained layer 3 is then transferred to the first receiving substrate 4 by splitting the composite structure 28 at the region of weakness 7 to produce a first product wafer 29, including the first strained layer 3 and receiving substrate 4, as shown in FIGS. 5g and 6c, and a first donor wafer 10, including at least a portion of the matching layer 2.

In one embodiment, the strained layer is transferred to a layer of an oxide of the strained layer material after the strained layer is transferred to a receiving substrate. After the transfer, preferably any remaining portion of the matching layer is removed from the strained layer, and the transferred strained layer is epitaxially grown to increase its thickness.

Preferably, the strained layer of this embodiment is of silicon and the oxide is silica. When these materials are used, the critical thickness of the strained layer, which is the thickness beyond which the layer relaxes and defects can typically appear in the crystalline structure of the layer, can be significantly increased. This consequently permits a thicker strained layer to be produced than can be produced with the strained silicon being associated directly with silicon germanium. The strained silicon layer can be thickened by growing to achieve a thickness of around 60 nm. Preferably, the strained silicon layer is thickened by growing to a thickness of between about 40 nm and 60 nm.

While illustrative embodiments of the invention are disclosed herein, it will be appreciated that numerous modifications and other embodiments may be devised by those skilled in the art. For example, while in the preferred embodiment a strained silicon film 3 in transferred, other types of films of a semiconductor able to be strained and transferred can be transferred according to a process of the invention. Additionally, in the semiconductor layers, other constituents may be added thereto, such as carbon with a carbon concentration in the layer in question of less than or equal to about 50% or more preferably with a concentration of less than or equal to about 5%. Therefore, it will be understood that the appended claims are intended to cover all such modifications and embodiments that come within the spirit and scope of the present invention.

What is claimed is:

1. A method of preparing a semiconductor wafer having a strained layer which comprises:
    growing a strained layer in a strained state to a desired thickness on a matching layer on a donor substrate, wherein the matching layer has a matching lattice parameter that is sufficiently different than the lattice parameter of the strained layer so that the strained layer remains in the strained state;
    growing a strain retention layer of strained SiC on the strained layer to retain the strained layer in a strained state during transfer of the strained layer to form the semiconductor wafer;
    providing a weakened region in the matching layer;
    bonding the strain retention layer to an insulating or semi-insulating layer; and
    transferring a part of the matching layer, the strain retention layer and the strained layer to the insulating or semi-insulating layer thus forming a semiconducting layer having strained layers thereon.

2. The method of claim 1, wherein the strained layer and strain retention layer each has a thickness of up to about 20 nm and the insulating or semi-insulating layer is an oxide.

3. The method of claim 1, wherein the strained layer has a thickness of up to about 20 nm and is strained sufficiently for improving its electrical properties compared to the same semiconductor material in a relaxed state.

4. The method of claim 1, wherein strained layer is provided at a thickness of 40 to 60 nm.

5. The method of claim 1, wherein the insulating or semi-insulating layer is part of a receiver substrate.

6. The method of claim 5, wherein the strain retention layer is molecularly bonded to the insulating or semi-insulating layer of the receiver substrate.

7. The method of claim 5, which further comprises removing the portion of the transferred portion of the matching layer from the receiver wafer.

8. The method of claim 5, wherein the receiving substrate is silicon, the insulating or semi-insulating layer is an oxide layer and the strained layer is a strained SiC, Si, SiGe or SiGeC layer.

9. The method of claim 5, wherein, after bonding, an intermediate structure is formed comprising the donor substrate; the matching layer upon the donor substrate, the strained layer; the insulating or semi-insulating layer and the receiver substrate.

10. The method of claim 5, wherein the insulating or semi-insulating layer is an oxide layer and the strained layer is a strained SiC, Si, SiGe or SiGeC layer having a thickness of up to about 20 nm, and wherein the insulating or semi-insulating layer of the receiver substrate is molecularly bonded to the strained layer of the donor substrate and the matching layer includes a weakened region therein that defines the part of the matching layer that is to be transferred to the receiver substrate.

11. The method of claim 10, wherein the matching layer is a Group III-V semiconductor material and the strained layer is SiC.

* * * * *

UNITED STATES PATENT AND TRADEMARK OFFICE
CERTIFICATE OF CORRECTION

PATENT NO. : 7,803,694 B2
APPLICATION NO. : 12/170583
DATED : September 28, 2010
INVENTOR(S) : Ghyselen et al.

It is certified that error appears in the above-identified patent and that said Letters Patent is hereby corrected as shown below:

Title Page:

Item (75) Inventors, change the city of residence of Thomas Skotnicki from "Crolles-Monfort" to -- Crolles-Montfort --

Signed and Sealed this

Sixteenth Day of November, 2010

David J. Kappos
*Director of the United States Patent and Trademark Office*